United States Patent [19]
Park et al.

[11] Patent Number: 5,682,113
[45] Date of Patent: Oct. 28, 1997

[54] PULSE EXTENDING CIRCUIT

[75] Inventors: Jong Hoon Park, Kyungki-do; Jae Woon Kim, Seoul, both of Rep. of Korea

[73] Assignee: LG Semicon Co., Ltd., Chungcheongbuk-do, Rep. of Korea

[21] Appl. No.: 534,973

[22] Filed: Sep. 27, 1995

[51] Int. Cl.$^6$ .................................................. H03K 3/017
[52] U.S. Cl. ........................ 327/174; 327/176; 327/261
[58] Field of Search ................................ 327/172, 174, 327/175, 176, 165, 166, 31, 36, 100, 261, 263, 264, 276

[56] References Cited

U.S. PATENT DOCUMENTS

| | | | |
|---|---|---|---|
| 3,068,417 | 12/1962 | Fiske | 327/174 |
| 3,075,148 | 1/1963 | Faust | 327/174 |
| 4,145,651 | 3/1979 | Ripingill, Jr. | 327/174 |
| 4,200,810 | 4/1980 | Cain et al. | 327/174 |
| 4,398,154 | 8/1983 | Lee | 327/174 |
| 4,931,998 | 6/1990 | Ootani et al. | 365/230.01 |
| 4,947,374 | 8/1990 | Wada et al. | 365/195 |
| 5,309,034 | 5/1994 | Ishibashi | 327/174 |
| 5,319,607 | 6/1994 | Fujii et al. | 365/233.5 |
| 5,554,946 | 9/1996 | Curran et al. | 327/175 |

*Primary Examiner*—Timothy P. Callahan
*Assistant Examiner*—My-Trang Nu Ton
*Attorney, Agent, or Firm*—Morgan, Lewis and Bockius LLP

[57] ABSTRACT

A pulse extending circuit includes a pulse extension inverting device for extending an input pulse signal by a predetermined width; and a delay device for extending the signal output from the pulse extension inverting device; thereby increasing a delay effect.

15 Claims, 8 Drawing Sheets

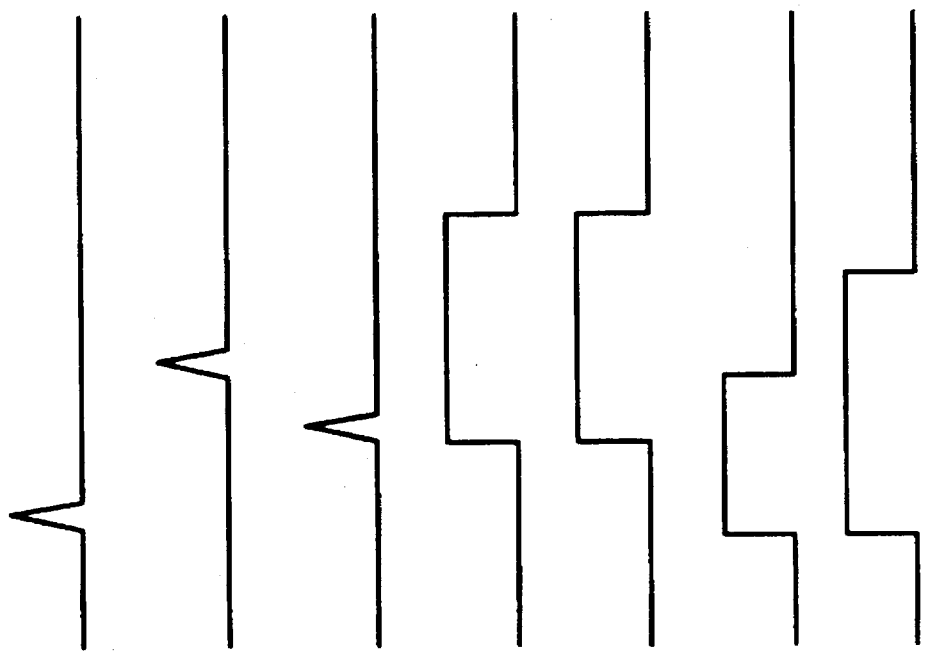
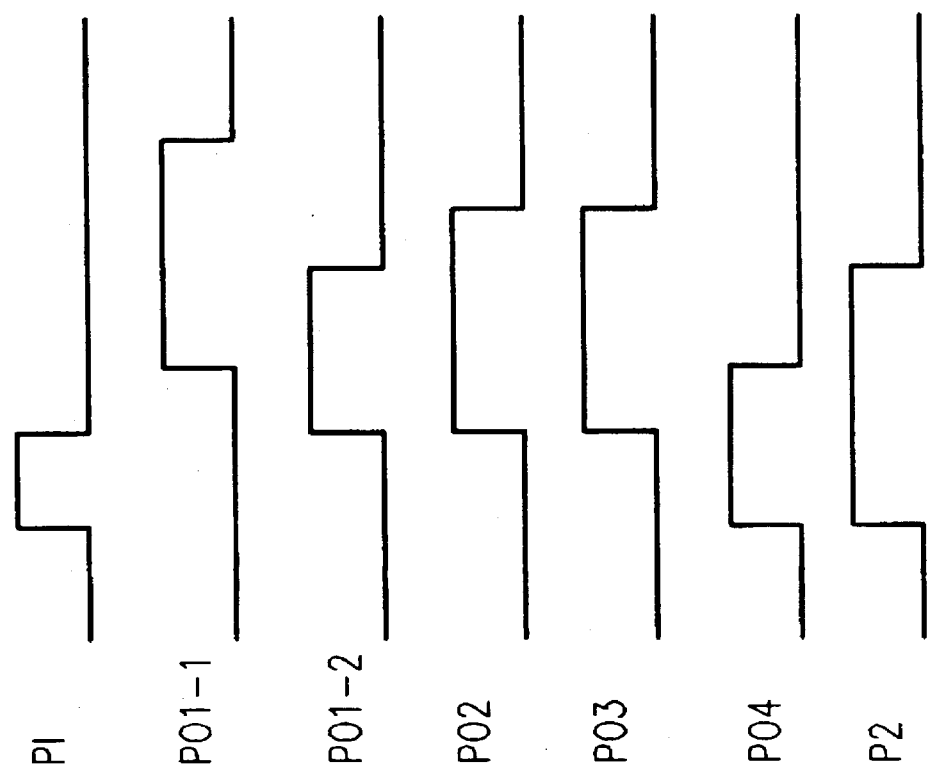

PULSE EXTENDING CIRCUIT

BACKGROUND OF THE INVENTION

1. Field of the Invention

The present invention relates to a pulse extending circuit for extending the pulsewidth by using a delay circuit in a semiconductor memory circuit. More particularly, the present invention relates to a pulse extending circuit for effectively extending the pulsewidth of a signal of a short pulsewidth input, thereby preventing the false operation of the semiconductor memory circuit.

2. Discussion of the Related Art

Generally, a pulse extending circuit extends the pulsewidth of a pulse by using a delay circuit. As shown in FIG. 1a, a general delay circuit used in the pulse extending circuit includes a PMOS transistor P101 in which an input pulse signal PI is inverted to be taken as the gate input and the source is connected to a power source VCC; an NMOS transistor N101 in which input pulse signal PI becomes the gate input, the drain is coupled to the drain of PMOS transistor P101, and the source is connected to the ground VSS; a resistor R101 in which one end is connected to the drain of PMOS transistor P101 and the other end is coupled to a pulse signal output P01-1; and a capacitor C101 connected to the other end of resistor R101 and to the ground VSS.

Another general delay circuit, as shown in FIG. 1b, has a PMOS transistor P102 in which input pulse signal PI is inverted to be taken as the gate input, the source is connected to power source VCC, and the drain is coupled to pulse signal output P01-3; an NMOS transistor N102 in which input pulse signal PI becomes the gate input, the drain is coupled to the drain of PMOS transistor P102, and the source is connected to the ground VSS; and a capacitor C102 connected to the drain of PMOS transistor P102 and to the ground VSS.

In the general delay circuits of FIGS. 1a and 1b, input pulse signal PI is delayed by the time constants of resistor R101 and capacitors C101 and C102 at the output terminals of PMOS transistors P101 and P102 and NMOS transistors N101 and N102, respectively. Then, the signal is output as pulse output signal P01-1 or P01-2. Here, pulse output signal P01-1 of FIG. 1a has a delay time due to the component of resistor R101, as compared with pulse output signal P01-2 of FIG. 1b. In those delay circuits shown in FIGS. 1a and 1b, the response becomes slow and the delay time is shortened.

As shown in FIG. 1c, another conventional delay circuit, which is disclosed in U.S. Pat. No. 5,319,607, includes a PMOS transistor P103 in which input pulse signal PI is inverted to become the gate input, and the source is connected to power source VCC; a resistor R102 in which one end is coupled to the drain of PMOS transistor P103 and the other end is coupled to pulse signal output P03; an NMOS transistor N103 in which input pulse signal PI becomes the gate input, the drain is coupled to the other end of resistor R102, and the source is coupled to the ground VSS; a capacitor C103 coupled to the other end of resistor R102 and to the ground VSS; a PMOS transistor P104 in which pulse output signal P03 output from the other end of resistor R102 is inverted to become the gate input, the source is connected to power source VCC, and the drain is coupled to the final pulse signal output P0; a capacitor C104 coupled to the drain of PMOS transistor P104 and to the ground VSS; a resistor R103 in which one end is coupled to the drain of PMOS transistor P104; and an NMOS transistor N104 in which pulse output signal P03 output from the other end of resistor R102 becomes the gate input, the drain is coupled to the other end of resistor R103, and the source is coupled to the ground VSS.

In the conventional delay circuit shown in FIG. 1c, there is a difference in delay time because, when input pulse signal PI is changed from the low level to the high level as shown in FIG. 2c, capacitor C103 becomes the delay component, and when input pulse signal PI is transited from the high level to the low level, resistor R102 and capacitor C103 become the delay components. Thus, pulse output signal P03 has a longer delay time in going from the low level to the high level than in going from the high level to the low level. In the delay circuit of FIG. 1c, the response to the input pulse signal is faster than that of FIGS. 1a and 1b. However, the response to the input pulse signal becomes slow due to the capacitor placed at the output terminal.

Another conventional delay circuit, which is disclosed in U.S. Pat. No. 4,947,374, is shown in FIG. 1d and comprises a PMOS transistor P105 in which input pulse signal PI is inverted to become the gate input, and the source is coupled to power source VCC; a PMOS transistor P106 in which input pulse signal PI is inverted to become the gate input, and the source is connected to the drain of PMOS transistor P105; a PMOS transistor P107 in which input pulse signal PI is inverted to become the gate input, and the source is coupled to the drain of PMOS transistor P106; a PMOS transistor P108 in which the source is coupled to the drain of PMOS transistor P107 and the drain is coupled to pulse signal output P03; an NMOS transistor N105 in which input pulse signal PI is taken as the gate input, the drain is coupled to the drain of PMOS transistor P108, and the source is coupled to the ground VSS; a capacitor C105 coupled to the drain of PMOS transistor P108 and to the ground VSS; a PMOS transistor P109 in which pulse output signal P03 is inverted to become the gate input, the source is coupled to power source VCC, and the final pulse output signal P0 is output through the drain; and an NMOS transistor N106 in which pulse output signal PO3 is taken as the gate input, the drain is coupled to the drain of PMOS transistor P109, and the source is coupled to the ground VSS.

The conventional delay circuit shown in FIG. 1d uses a plurality of PMOS transistors P106, P107, and P108 instead of the resistors of the previous circuits to provide the effect of resistance as shown in FIG. 2c. Specifically, when input pulse signal PI is transited from the low level to the high level, capacitor C105 becomes the delay component. When input pulse signal PI is transited from the high level to the low level, PMOS transistors P106, P017, and P108 and capacitor C105 become the delay components. This characteristic creates a difference in delay time. Thus, in pulse output signal P03, the delay time to transit from the high level to the low level is longer than that from the low level to the high level.

In the delay circuit of FIG. 1d, the response to the input pulse signal is faster than that of FIGS. 1a and 1b. However, the response to the input pulse signal becomes slow due to the capacitor placed at the output terminal.

Another delay circuit, which is disclosed in U.S. Pat. No. 4,931,998, is shown in FIG. 1e and comprises a PMOS transistor P110 in which input pulse signal PI is inverted to become the gate input, and the source is connected to power source VCC; a resistor R104 in which one end is connected to the drain of PMOS transistor P110 and the other end is connected to pulse signal output port P04; an TMOS transistor N106 in which input pulse signal PI is taken as the gate input, the drain is connected to the other end of resistor R104, and the source is connected to the ground VSS; a PMOS transistor P111 in which pulse output signal P04 is inverted to become the gate input, the source is connected to power source VCC, and the final pulse output signal P0 is output through the drain; a resistor R105 in which one end is connected to the drain of PMOS transistor P111; and an NMOS transistor N107 in which pulse output signal P04 is taken as the gate input, the drain is connected to the other end of resistor R105, and the source is connected to the ground VSS.

In the conventional delay circuit constructed as in FIG. 1e, the capacitors are removed. As shown in FIG. 2d, in going from the high level to the low level, this circuit is faster than the delay circuit of FIG. 1c. However, in going from the low level to the high level the circuit is less effective than the delay circuit of FIG. 1c because the delay depends only on the resistors. In other words, the delay circuit of FIG. 1e has a faster response to the input pulse signal but shorter delay time because the delay components are merely the resistors.

Accordingly, using resistors and capacitors, the conventional delay circuits make responses to the input pulse signal faster or slower as long as the resistor and capacitor at the output terminal elongates delay. However, the delay time is rendered shorter.

SUMMARY OF THE INVENTION

The present invention has been made in view of the above circumstances and has as an object to provide a pulse extending circuit in which, when enabling an input pulse signal, a capacitor acts as the load and, when disabling the input pulse signal, both a resistor and the capacitor act as the load. Thus, the input signal is enabled faster and is disabled slower, extending the signal even when a small input pulse signal is input.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the pulse extending circuit of this invention comprise a pulse extension inverting portion for extending an input pulse signal by a predetermined width, and a delay portion for extending the signal output from the pulse extension inverting portion.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings:

FIGS. 7a and 7b are diagrams of waveforms present at the respective components of FIGS. 5a–5b.

DETAILED DESCRIPTION OF THE INVENTION

Figure 1A:
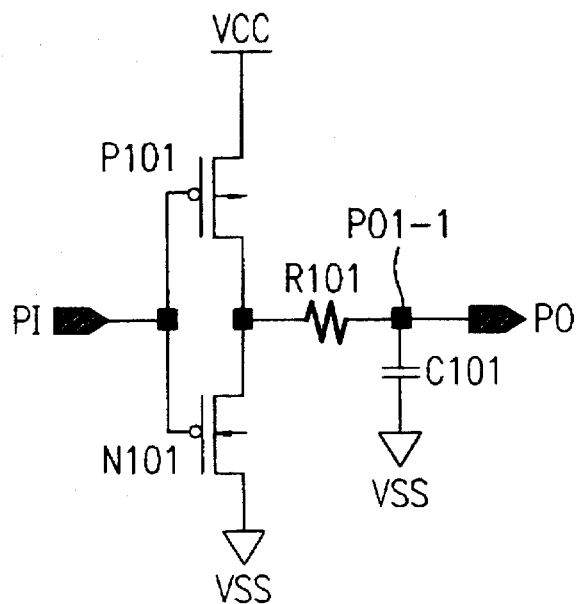
FIGS. 1a–1e are circuit diagrams of conventional delay circuits.
Figure 1B:
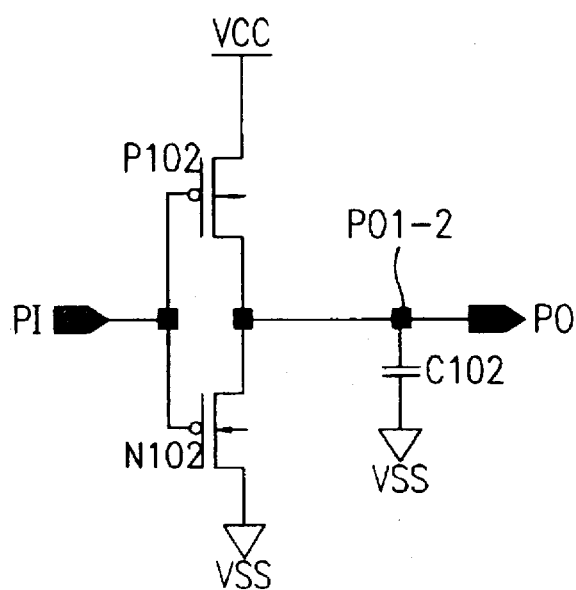
Figure 1C:
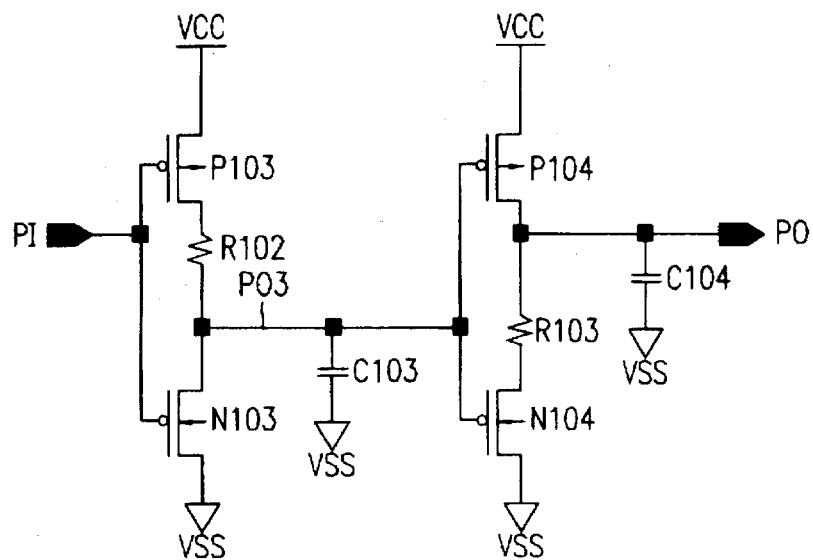
Figure 1D:
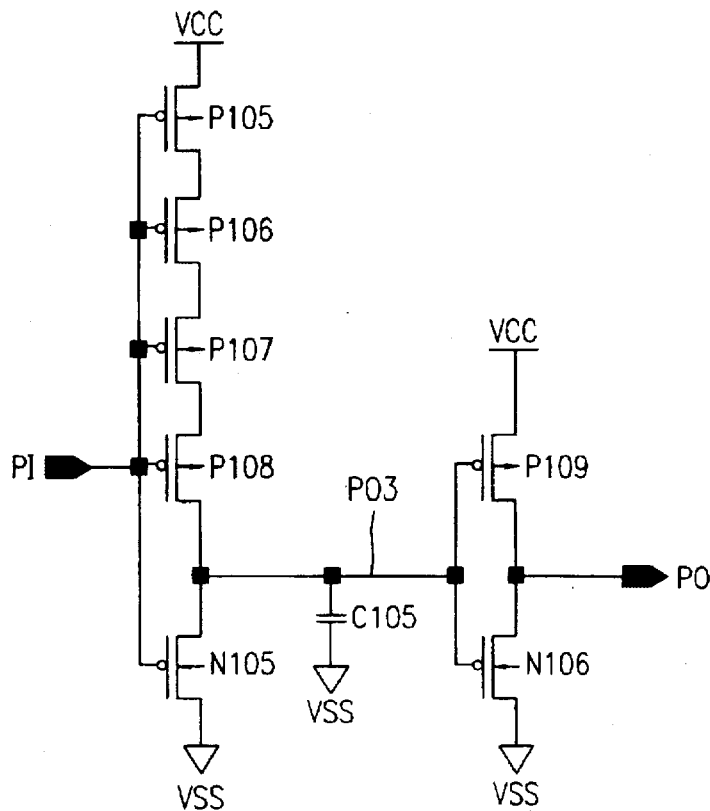
Figure 1E:
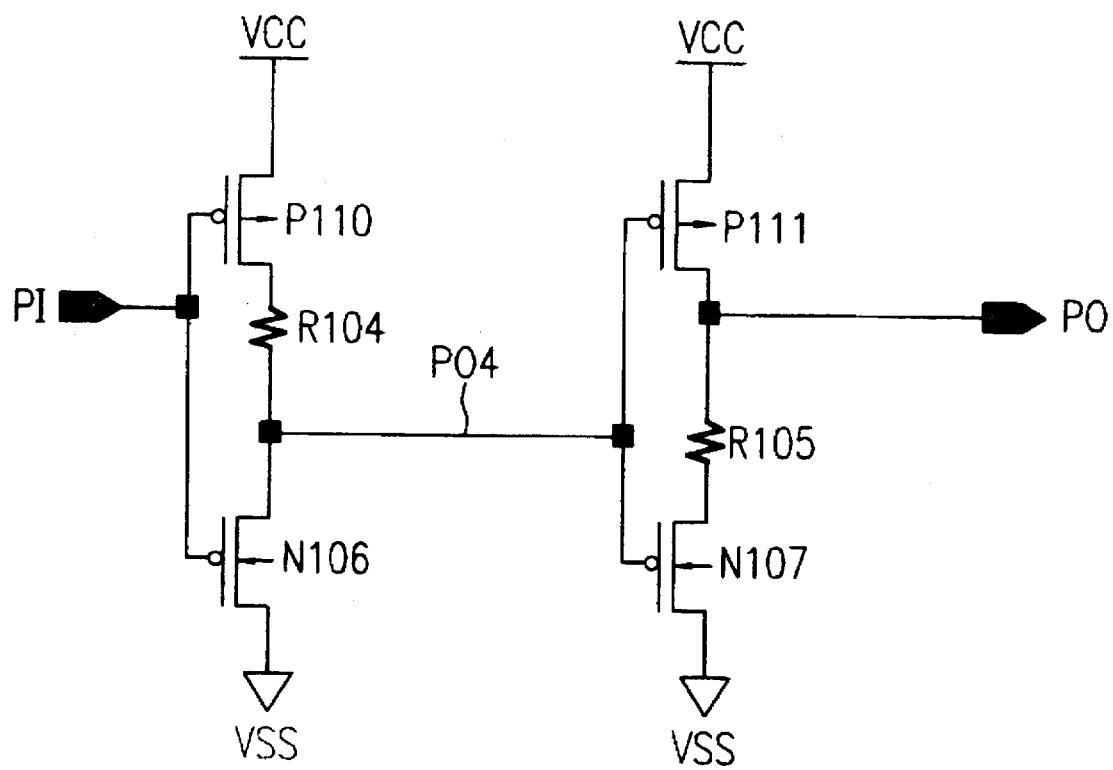
Figure 2A:
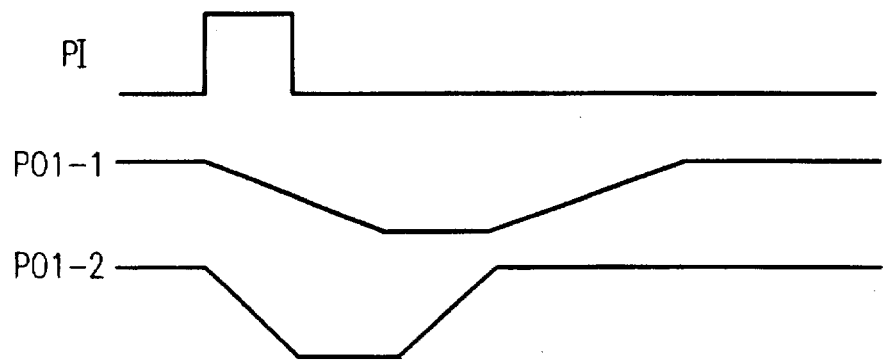
FIGS. 2a–2d are diagrams of waveforms present at the respective components of FIGS. 1a–1e.
Figure 2B:
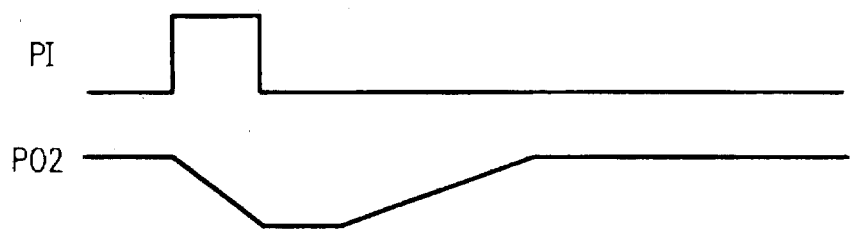
Figure 2C:
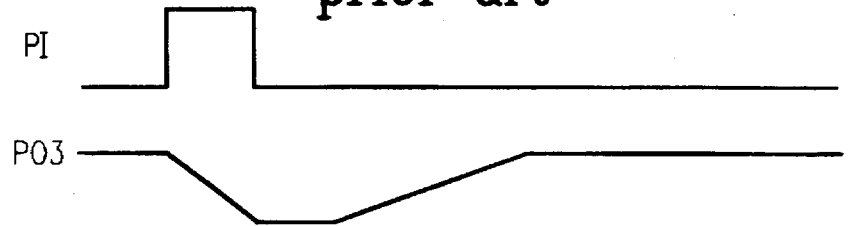
Figure 2D:
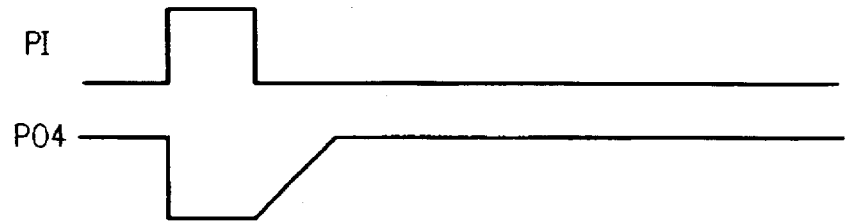
Figure 3:
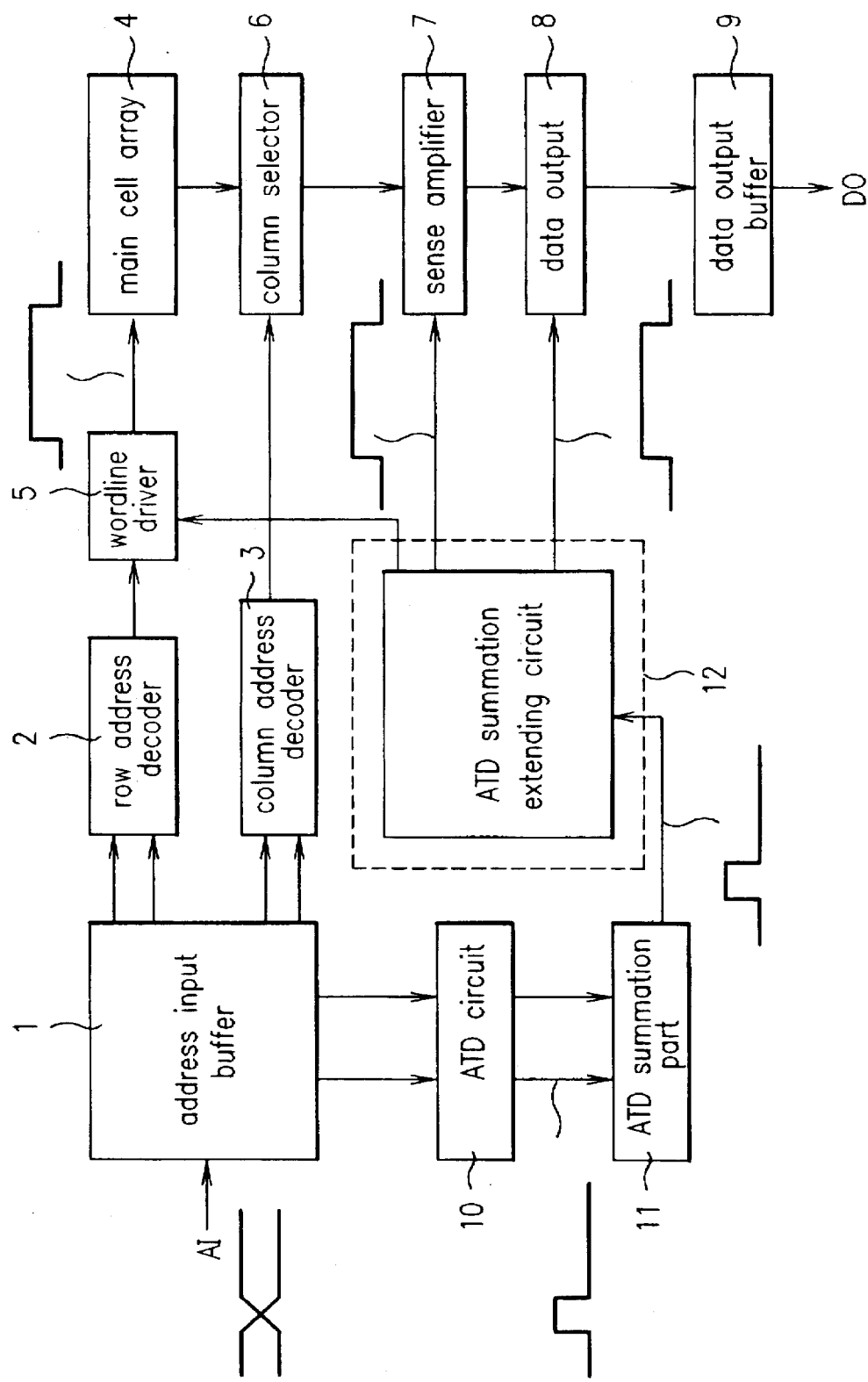
FIG. 3 is a block diagram of a semiconductor memory circuit with which the present invention is employed.

As shown in FIG. 3, a semiconductor memory circuit with which the present invention is employed comprises an address input buffer 1 for receiving an input address AI and converting it from a TTL level to a CMOS level, a row address decoder and column address decoder 2 and 3, respectively, for receiving and decoding the signal output from address input buffer 1, a wordline driver and column selector 5 and 6, respectively, for receiving the signals output from row address decoder 2 and column address decoder 3 and for selecting one cell of a main cell array 4, an address transition detector (ATD) circuit 10 for detecting the variation of address input buffer 1 and for generating a pulse used as an internal clock, an ATD summation circuit 11 for summing the pulses generated from a plurality of ATD 10, an ATD summation extending circuit 12 for extending the signal output from ATD summation circuit 11, a sense amplifier 7 for amplifying the signal output from column selector 6 according to the signal output from ATD summation extending circuit 12, a data output portion 8 for controlling the output from sense amplifier 7, and a data output buffer 9 for finally transmitting the data output from data output portion 8.

Here, the pulse extending circuit of the present invention is embodied in ATD summation extending circuit 12. The signal produced from ATD summation extending circuit 12 operates wordline driver 5, sense amplifier 7, and data output portion 8 only for a pulse period, thereby reducing power consumption for a long period.

Figure 4:
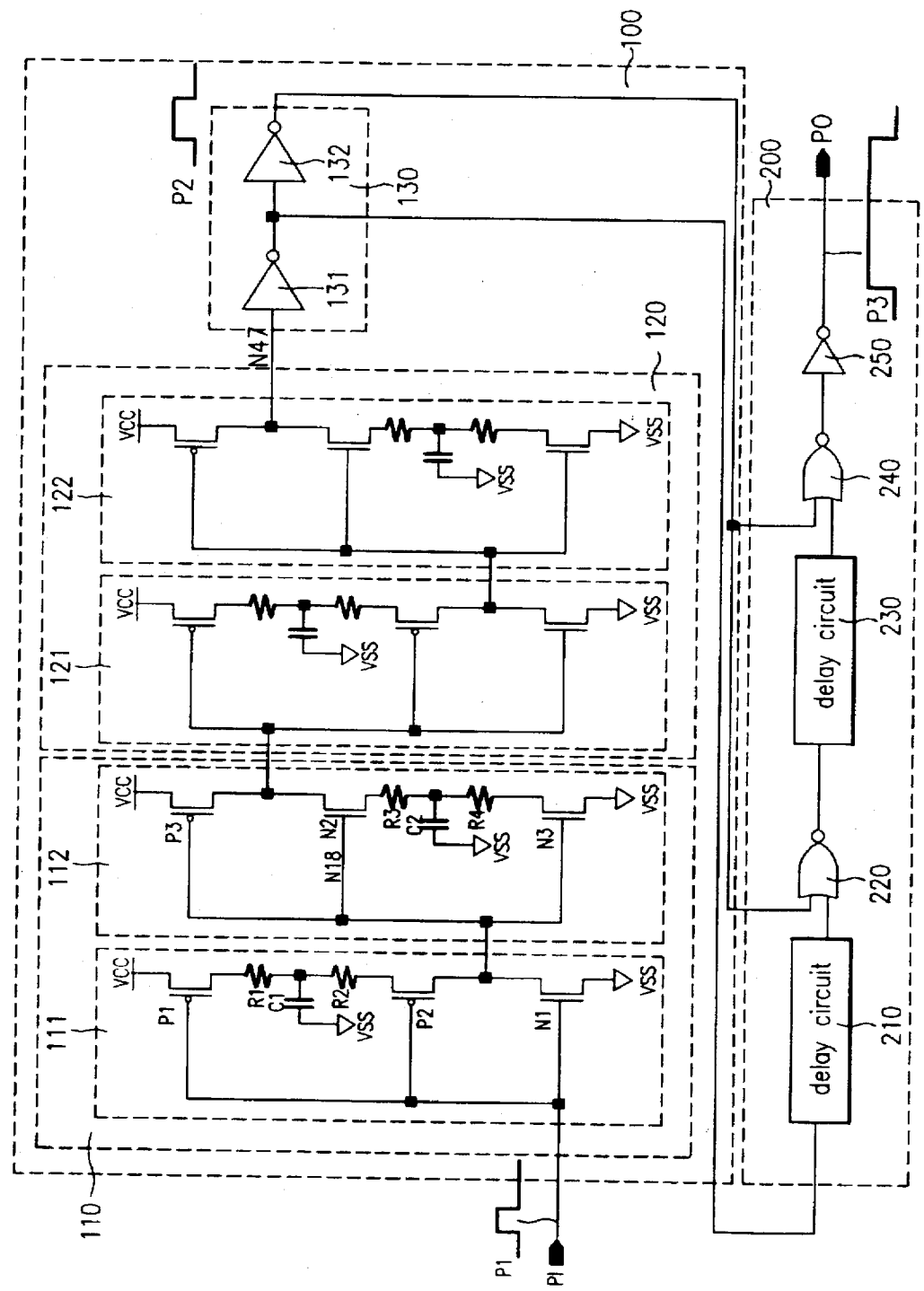
FIG. 4 is a circuit diagram of a pulse extending circuit according to the present invention.

As shown in FIG. 4, the pulse extending circuit of the present invention comprises a pulse extension inverting portion 100 and a delay portion 200. Pulse extension inverting portion 100 extends an input pulse signal P1 by a predetermined width and includes at least one of pulse extension inverting circuits 110 and 120 for extending the input pulse signal by a predetermined width, and an inverting portion 130 for stabilizing the signal output from pulse extension inverting circuits 110 and 120.

Each of pulse extension inverting circuits 110 and 120 includes a positive pulse extension inverter 111 for extending the input pulse signal for a predetermined width when it is positive and a negative pulse extension inverter 112 for extending the input pulse signal for a predetermined width when it is negative. The respective positions of positive pulse extension inverter 111 and negative pulse extension inverter 112 may be changed so that the input pulse signal P1 is first extended by negative pulse extension inverter 112 and then by positive pulse extension inverter 111.

Positive pulse extension inverter 111 comprises a PMOS transistor P1 in which the inverted input pulse signal or the inverted output signal of negative pulse extension inverter 112 is taken as the gate input, and the source is connected to power source VCC; resistors R1 and R2 serially connected to the drain of PMOS transistor P1; a capacitor C1 coupled to resistors R1 and R2 and the ground VSS; a PMOS transistor P2 in which the inverted input pulse signal or the inverted output signal of negative pulse extension inverter 112 is taken as the gate input, and the source is connected to resistor R2; and an NMOS transistor N1 in which the inverted input pulse signal or the inverted output signal of negative pulse extension inverter 112 is taken as the gate input, the drain is connected to the drain of PMOS transistor P2, and the source is connected to the ground VSS.

Negative pulse extension inverter 112 comprises a PMOS transistor P3 in which the inverted input pulse signal or the inverted output signal of positive pulse extension inverter 111 is taken as the gate input, and the source is connected to power source VCC; an NMOS transistor N2 in which the input pulse signal or the output signal of positive pulse extension inverter 111 is taken as the gate input, and the drain is connected to the drain of PMOS transistor P3; resistors R3 and R4 serially connected to the source of NMOS transistor N2; a capacitor C2 coupled to resistors R3 and R4 and the ground VSS; and an NMOS transistor N3 in which the input pulse signal or the output signal of positive pulse extension inverter 111 is taken as the gate input, the drain is connected to resistor R4, and the source is connected to the ground VSS.

Inverting portion 130 includes an inverter 131 for inverting the signal output from pulse extension inverting circuits 110 and 120 and for outputting it to delay portion 200, and an inverter 132 for inverting the signal output from inverter 131 and outputting it to delay portion 200.

Delay portion 200 extends the signal output from pulse extension inverting portion 100, and includes a delay circuit 210 for delaying the signals output from inverter 131, a NOR gate 220 NORing the signal output from delay circuit 210 and the signal output from inverter 132, a delay circuit 230 for delaying the signal output from NOR gate 220, a NOR gate 240 for NORing the signal output from delay circuit 230 and the signal output from inverter 132, and an inverter 250 for inverting the signal output from NOR gate 240 and providing the inverted signal as output signal P0.

The operation of the pulse extension circuit of the present invention will be described below with reference to FIGS. 5a–5b, 6a–6d, and 7a–7b.

Figure 5A:
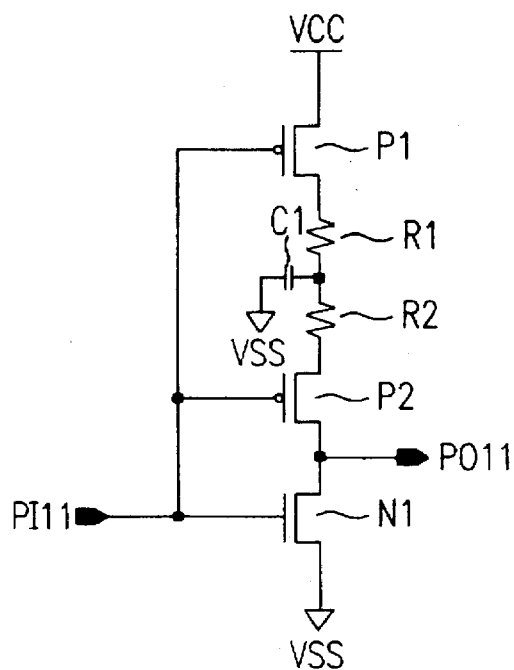
FIG. 5a is a circuit diagram of the positive pulse extending inverter of FIG. 4.
Figure 5B:
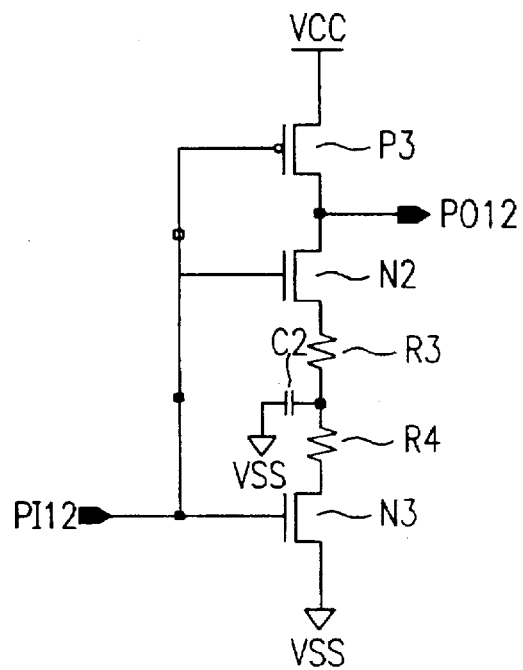
FIG. 5b is a circuit diagram of the negative pulse extending inverter of FIG. 4.

FIGS. 5a and 5b show positive pulse extension inverter 111 and negative pulse extension inverter 112, respectively. FIGS. 6a–6d are waveform diagrams indicative of the operation of positive pulse extension inverter 111 and negative pulse extension inverter 112.

Figure 6A:
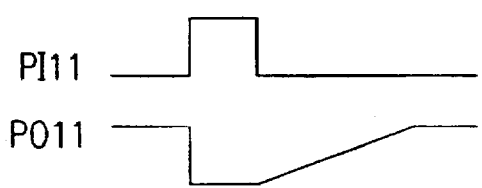
FIGS. 6a–6d are diagrams of waveforms present at the respective components of FIGS. 5a and 5b.

Positive pulse extension inverter 111 of FIG. 5a fast enables the input pulse signal PI11, positive signal, according to NMOS transistor N1, and slowly disables it according to PMOS transistors P1 and P2, resistors R1 and R2, and capacitor C1. Resistors R1 and R2 may be replaced by a single equivalent resistor or other known alternative resistive elements. As shown in FIG. 6a, when input pulse signal PI11 is a positive pulse signal, a transition of PI11 from the low level to the high level results in a fast transition of PO11 from the high level to the low level. Conversely, a transition of pulse input signal PI11 from the high level to the low level results in a slow transition of PO11 from the low level to the high level. In this manner, the input pulse signal is extended.

Figure 6C:
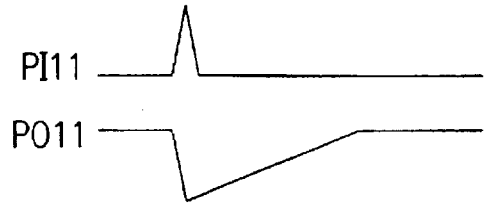

As shown in FIG. 6c, even when input pulse signal PI11 is a short pulse, pulse output signal PO11, output when input pulse signal PI11 is transited from the low level to the high level, quickly transitions to the low level. Pulse output signal PO11, output when input pulse signal PI11 transitions from the high level to the low level, slowly transitions to the high level. By doing so, the extended pulse output signal PO11 is output.

Figure 6B:
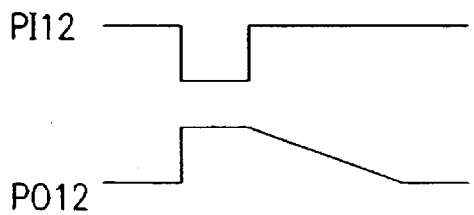

Negative pulse extension inverter 112 of FIG. 5b fast enables the input pulse signal PI12, which is reversed from input pulse signal PI11 to be a negative signal, according to PMOS transistor P3, and slowly disables it according to NMOS transistors N2 and N3, resistor's R3 and R4, and capacitor C2. Resistors R3 and R4 may be replaced by a single equivalent resistor or other known alternative resistive elements. In other words, as shown in FIG. 6b, when input pulse signal PI12 is a negative pulse signal, a transition of PI12 from the high level to the low level results in a fast transition of PO12 from the low level to the high level. Conversely, a transition of pulse input signal PI12 from the low level to the high level results in a slow transition of PO12 from the high level to the low level. In this manner, the input pulse signal is extended.

Figure 6D:
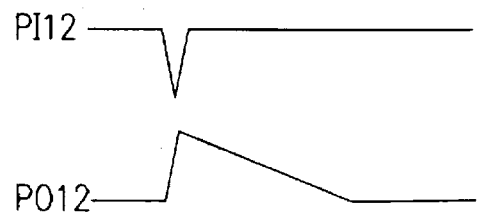

As shown in FIG. 6d, even when input pulse signal PI12 is a short pulse, pulse output signal PO12 output when input pulse signal PI12 is transited from the high level to the low level, is fast transited to the high level. Pulse output signal PO12 output when input pulse signal PI12 is transited from the low level to the high level, is slowly transited to the low level. By doing so, the extended pulse output signal PO12 is output.

In case that pulse extension inverting circuits 110 and 120 of the pulse extending circuit are made up only of positive pulse extension inverter 111 of FIG. 5a, positive input pulse signal PI11 is extended and output. In case that pulse extension inverting circuits 110 and 120 are made up only of negative pulse extension inverter 112 of FIG. 5b, negative input pulse signal PI12 is extended and output.

As shown in FIG. 4, in case that pulse extension inverting circuits 110 and 120 of the pulse extending circuit are made up of positive pulse extension inverter 111 and negative pulse extension inverter 112, the input pulse signal is extended to promote the delay effect, whether the input pulse signal is a positive signal or negative signal. Pulse extension inverting circuits 110 and 120 are connected in plurality, precisely extending the input pulse signal. The operation in case that pulse extension inverting circuits 110 and 120 are made up of pulse extension inverter 111 and negative pulse extension inverter 112, as shown in FIG. 4, will be explained with reference to FIGS. 6a–6d.

Input pulse signal P1 is extended to a negative pulse signal, as shown in FIG. 6a, by positive pulse extension inverter 111. The extended negative pulse signal is re-extended to a positive pulse signal, as shown in FIG. 6b, by negative pulse extension inverter 112. This result is applied to pulse extension inverting circuit 120, promoting the delay effect.

The signal output from pulse extension inverting circuits 110 and 120 is stabilized through inverters 131 and 132 of inverting portion 130, and output as a signal P2 of a predetermined pulsewidth.

The pulse output signal output from inverter 131 of inverting portion 130 is delayed through general delay circuit 210, and NORed with pulse output signal P2 output from inverter 132 by NOR gate 220. The signal output from NOR gate 220 is delayed through delay circuit 230, and NORed with pulse output signal P2 output from inverter 132 by NOR gate 240, extending by an intended pulsewidth.

The signal output from NOR gate 240 is finally output as pulse output signal P0 or P3 inverted through inverter 250 and extended by a desired pulsewidth.

As shown in FIG. 7a, in case that pulse extension inverting circuits 110 and 120 of the present invention are used, during enable, the resistor and capacitor at the output terminal do not act as the load so that enable is performed faster than the conventional delay circuits of FIGS. 1a–1e.

During disable, since the resistor and capacitor both act as the load, disable is performed slowly, producing a signal of a longer pulsewidth than the input signal. When pulse extension inverting circuits 110 and 120 of the present invention are used, a signal of a general pulsewidth is output, as shown in FIG. 7b, even though a short-pulse signal is input.

In conclusion, the pulse extending circuit of the present invention responds to the input signal faster than other pulse extending circuits using a conventional delay circuit, thereby increasing the delay effect. This invention can also be employed by an automatic power down block whereas the conventional delay circuit is used with an ATD block.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A pulse extending circuit comprising:
   a pulse extension inverting unit for extending an input pulse signal by a predetermined width and outputting an extended pulse signal; and
   a delay unit coupled to the pulse extension inverting unit for further extending the extended pulse signal extended by the pulse extension inverting unit;
   wherein the delay unit includes:
      a first delay circuit for delaying the signal output from the pulse extension inverting unit;
      first NOR gate for NORing a signal output from the first delay circuit and the signal output from the pulse extension inverting unit:
      a second delay circuit for delaying a signal output from the first NOR gate;
      a second NOR gate for NORing a signal output from the second delay circuit and the signal output from the pulse extension inverting unit; and
      an inverter for inverting a signal output from the second NOR gate.

2. The pulse extending circuit as claimed in claim 1, wherein the pulse extension inverting unit comprises:
   a plurality of pulse extension inverting circuits for extending the input pulse signal by a predetermined width; and
   an inversion unit for stabilizing a signal output from the pulse extension inverting circuits.

3. The pulse extending circuit as claimed in claim 2, wherein the pulse extension inverting circuits comprise a positive pulse extension inverter for extending the input pulse signal for a predetermined width when the input pulse signal is positive.

4. The pulse extending circuit as claimed in claim 3, wherein the positive pulse extension inverter comprises:
   a first PMOS transistor having a gate, a drain, and a source, wherein an inverted input pulse signal is connected to the gate of the first PMOS transistor and a power source is connected to the source of the first PMOS transistor;
   first and second resistors serially connected to the drain of the first PMOS transistor;
   a capacitor coupled to the first and second resistors and a ground;
   a second PMOS transistor having a gate, a drain, and a source, wherein the inverted input pulse signal is connected to the gate of the second PMOS transistor and the second resistor is connected to the source of the second PMOS transistor; and
   an NMOS transistor having a gate, a drain, and a source, wherein the inverted input pulse signal is connected to the gate of the NMOS transistor, the drain of the second PMOS transistor is connected to the drain of the NMOS transistor, and the ground is connected to the source of the NMOS transistor.

5. The pulse extending circuit as claimed in claim 2, wherein the pulse extension inverting circuits comprise a negative pulse extension inverter for extending the input pulse signal for a predetermined width when the input pulse signal is negative.

6. The pulse extending circuit as claimed in claim 5, wherein the negative pulse extension inverter comprises:
   a PMOS transistor having a gate, a drain, and a source, wherein an inverted input pulse signal is connected to the gate of the PMOS transistor, and a power source is connected to the source of the PMOS transistor;
   a first NMOS transistor having a gate, a drain, and a source, wherein the inverted input pulse signal is connected to the gate of the first NMOS transistor and the drain of the PMOS transistor is connected to the drain of the first NMOS transistor;
   a first resistor and a second resistor serially connected to the source of the first NMOS transistor;
   a capacitor coupled to the first and second resistors and a ground; and
   a second NMOS transistor having a gate, a drain, and a source, wherein the inverted input pulse signal is connected to the gate of the second NMOS transistor, the second resistor is connected to the drain of the second NMOS transistor, and the ground is connected to the source of the second NMOS transistor.

7. The pulse extending circuit as claimed in claim 2, wherein the pulse extension inverting circuits comprise:
   a positive pulse extension inverter for extending the input pulse signal for a predetermined width and providing a resulting signal output; and
   a negative pulse extension inverter for extending the input pulse signal for a predetermined width and providing a resulting signal output.

8. The pulse extending circuit as claimed in claim 7, wherein the positive pulse extension inverter comprises:
   a first PMOS transistor having a gate, a drain, and a source, wherein an inverted input pulse signal is connected to the gate of the first PMOS transistor and a power source is connected to the source of the first PMOS transistor;
   a first resistor and a second resistor serially connected to the drain of the first PMOS transistor;
   a capacitor coupled to the first and second resistors and a ground;
   a second PMOS transistor having a gate, a drain, and a source, wherein the inverted input pulse signal is connected to the gate of the second PMOS transistor and the second resistor is connected to the source of the second PMOS transistor; and an NMOS transistor having a gate, a drain, and a source, wherein the inverted input pulse signal is connected to the gate of the NMOS transistor, the drain of the second PMOS transistor is connected to the drain of the NMOS transistor, and the ground is connected to the source of the NMOS transistor.

9. The pulse extending circuit as claimed in claim 7, wherein the positive pulse extension inverter comprises:

a first PMOS transistor having a gate, a drain, and a source, wherein the signal of the negative pulse extension inverter is inverted and connected to the gate of the first PMOS transistor and a power source is connected to the source of the first PMOS transistor;

a first resistor and a second resistor serially connected to the drain of the first PMOS transistor;

a capacitor coupled to the first and second resistors and a ground;

a second PMOS transistor having a gate, a drain, and a source, wherein the signal output of the negative pulse extension inverter is inverted and connected to the gate of the second PMOS transistor and the second resistor is connected to the source of the second PMOS transistor; and an NMOS transistor having a gate, a drain, and a source, wherein the signal output of the negative pulse extension inverter is inverted and connected to the gate of the NMOS transistor, the drain of the second PMOS transistor is connected to the drain of the NMOS transistor, and the ground is connected to the source of the NMOS transistor.

10. The pulse extending circuit as claimed in claim 2, wherein the pulse extension inverting circuits comprise:

a negative pulse extension inverter for extending the input pulse signal for a predetermined width; and a positive pulse extension inverter for extending the input pulse signal for a predetermined width.

11. The pulse extending circuit as claimed in claim 10, wherein the negative pulse extension inverter comprises:

a PMOS transistor having a gate, a drain, and a source, wherein an inverted input pulse signal is connected to the gate of the PMOS transistor, and a power source is connected to the source of the PMOS transistor;

a first NMOS transistor having a gate, a drain, and a source, wherein the inverted input pulse signal is connected to the gate of the first NMOS transistor and the drain of the PMOS transistor is connected to the drain of the first NMOS transistor;

a first resistor and a second resistor serially connected to the source of the first NMOS transistor;

a capacitor coupled to the first and second resistors and a ground; and a second NMOS transistor having a gate, a drain, and a source, wherein the inverted input pulse signal is connected to the gate of the second NMOS transistor, the second resistor is connected to the drain of the second NMOS transistor, and the ground is connected to the source of the second NMOS transistor.

12. The pulse extending circuit as claimed in claim 7, wherein the negative pulse extension inverter comprises:

a PMOS transistor having a gate, a drain, and a source, wherein a signal output from the positive pulse extension inverter is inverted and input to the gate of the PMOS transistor, and a power source is connected to the source of the PMOS transistor;

a first NMOS transistor having a gate, a drain, and a source, wherein the signal output from the positive pulse extension inverter is connected to the gate of the first NMOS transistor and the drain of the PMOS transistor is connected to the drain of the first NMOS transistor;

a first resistor and second resistor serially connected to the source of the first NMOS transistor;

a capacitor coupled to the first and second resistors and a ground; and a second NMOS transistor having a gate, a drain, and a source, wherein the signal output from the positive pulse extension inverter is connected to the gate of the second NMOS transistor, the second resistor is connected to the drain of the second NMOS transistor, and the ground is connected to the source of the NMOS transistor.

13. The pulse extending circuit as claimed in claim 2, wherein the inversion unit comprises:

a first inverter for inverting the signal output from the pulse extension inverting circuits to provide a first inverted signal and outputting the first inverted signal to the delay unit; and a second inverter for inverting the first inverted signal to provide a second inverted signal and outputting the second inverted signal to the delay unit.

14. A pulse extending circuit comprising:

a pulse extension inverting unit for extending an input pulse signal by a predetermined width and outputting an extended pulse signal; and a delay unit coupled to the pulse extension inverted unit for further extending the extended pulse signal extended by the pulse extension inverting unit;

wherein the pulse extension inverting unit comprises:

a plurality of pulse extension inverting circuits for extending the input pulse signal and an inversion unit for stabilizing a signal output from the pulse extension inverting circuits, the inversion unit including:

a first inverter for inverting the signal output from the pulse extension inverting circuits to provide a first inverted signal and outputting the first inverted signal to the delay unit and a second inverter for inverting the first inverted signal to provide a second inverted signal and outputting the second inverted signal to the delay unit.

15. A pulse extending circuit comprising:

a pulse extension inverting unit for extending an input pulse signal by a predetermined width and outputting an extended pulse signal; and a delay unit coupled to the pulse extension inverting unit for further extending the extended pulse signal extended by the pulse extension inverting unit;

wherein the delay unit includes:

a first delay circuit for delaying the signal output from the pulse extension inverting unit;

a first logic unit coupled to a signal output from the first delay circuit and the extended pulse signal output from the pulse extension inverting unit;

a second delay circuit for delaying a signal output from the first logic unit;

a second logic unit coupled to a signal output from the second delay circuit and the signal output from the pulse extension inverting unit; and a third logic unit coupled to a signal output from the second logic unit; and wherein the pulse extension inverting unit comprises:

a negative pulse extension inverter for extending the input pulse signal for a predetermined width; and a positive pulse extension inverter for extending the input pulse signal for a predetermined width.

* * * * *

UNITED STATES PATENT AND TRADEMARK OFFICE
CERTIFICATE OF CORRECTION

PATENT NO. : 5,682,113
DATED : October 28, 1997
INVENTOR(S) : Jong Hoon PARK et al.

It is certified that error appears in the above-identified patent and that said Letters Patent is hereby corrected as shown below:

Column 7, line 38, change "first NOR gate" to --a first NOR gate--.

Column 7, line 40, change "unit:" to --unit;--.

Column 10, line 25, change "inverted" to --inverting--.

Signed and Sealed this

Sixteenth Day of February, 1999

Attest:

Acting Commissioner of Patents and Trademarks

Attesting Officer